(12) United States Patent
Uematsu et al.

(10) Patent No.: US 9,858,181 B2
(45) Date of Patent: *Jan. 2, 2018

(54) MEMORY MODULE HAVING DIFFERENT TYPES OF MEMORY MOUNTED TOGETHER THEREON, AND INFORMATION PROCESSING DEVICE HAVING MEMORY MODULE MOUNTED THEREIN

(71) Applicant: Hitachi, Ltd., Tokyo (JP)

(72) Inventors: Yutaka Uematsu, Tokyo (JP); Satoshi Muraoka, Tokyo (JP); Hiroshi Kakita, Tokyo (JP); Akio Idei, Tokyo (JP); Yusuke Fukumura, Tokyo (JP); Satoru Watanabe, Tokyo (JP); Takayuki Ono, Tokyo (JP); Taishi Sumikura, Tokyo (JP); Yuichi Fukuda, Tokyo (JP); Takashi Miyagawa, Tokyo (JP); Michinori Naito, Tokyo (JP); Hideki Osaka, Tokyo (JP); Masabumi Shibata, Tokyo (JP); Hitoshi Ueno, Tokyo (JP); Kazunori Nakajima, Tokyo (JP); Yoshihiro Kondo, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 205 days.

This patent is subject to a terminal disclaimer.

(21) Appl. No.: 14/764,838

(22) PCT Filed: Jun. 20, 2013

(86) PCT No.: PCT/JP2013/067003
§ 371 (c)(1),
(2) Date: Jul. 30, 2015

(87) PCT Pub. No.: WO2014/203383
PCT Pub. Date: Dec. 24, 2014

(65) Prior Publication Data
US 2016/0092351 A1   Mar. 31, 2016

(51) Int. Cl.
*G06F 13/00* (2006.01)
*G06F 12/02* (2006.01)
(Continued)

(52) U.S. Cl.
CPC ...... *G06F 12/0246* (2013.01); *G06F 12/0638* (2013.01); *G11C 5/04* (2013.01);
(Continued)

(58) Field of Classification Search
CPC ......... G06F 12/0246; G06F 2212/7201; G06F 2212/2532; G11C 7/1072; G11C 16/0491
See application file for complete search history.

(56) References Cited

U.S. PATENT DOCUMENTS 6,928,512 B2 * 8/2005 Ayukawa ............ G11C 11/005
365/222
7,296,754 B2 * 11/2007 Nishizawa ........... G06K 19/072
235/492
(Continued)

FOREIGN PATENT DOCUMENTS

JP   2010-524059 A   7/2010

OTHER PUBLICATIONS

International Search Report PCT/JP2013/067003.

*Primary Examiner* — Charles Rones
*Assistant Examiner* — Han Doan
(74) *Attorney, Agent, or Firm* — Mattingly & Malur, PC

(57) ABSTRACT

A memory module having different types of memory mounted together on a double-sided substrate has a first edge and opposite second edge and includes a plurality of memory controllers, a plurality of flash memories, and a plurality of second memories having a higher signal trans-
(Continued)

mission rate than the flash memories. A socket terminal for connecting the double-sided substrate to a motherboard is formed on the front surface and the back surface of the double-sided substrate on the first edge side; the memory controllers are disposed on the second edge side; the second memories are disposed on the second edge side at positions opposite the positions at which the memory controllers are disposed; and the flash memories are disposed on at least the back surface thereof at positions that are closer to the first edge than are the positions at which the memory controllers and the second memories are disposed.

15 Claims, 20 Drawing Sheets

(51) Int. Cl.
*G11C 5/04* (2006.01)
*G11C 11/00* (2006.01)
*G06F 12/06* (2006.01)
*G11C 7/10* (2006.01)
*G11C 16/04* (2006.01)

(52) U.S. Cl.
CPC .......... *G11C 7/1072* (2013.01); *G11C 11/005* (2013.01); *G11C 16/0491* (2013.01); *G06F 2212/2532* (2013.01); *G06F 2212/7201* (2013.01)

(56) References Cited

U.S. PATENT DOCUMENTS

| | | |
|---|---|---|
| 2010/0095048 A1 | 4/2010 | Bechtolsheim et al. |
| 2010/0115191 A1 | 5/2010 | Hampel et al. |
| 2010/0238696 A1* | 9/2010 | Baek ................. H01L 24/16 |
| | | 365/51 |
| 2013/0086309 A1* | 4/2013 | Lee .................. G06F 12/0246 |
| | | 711/103 |

* cited by examiner

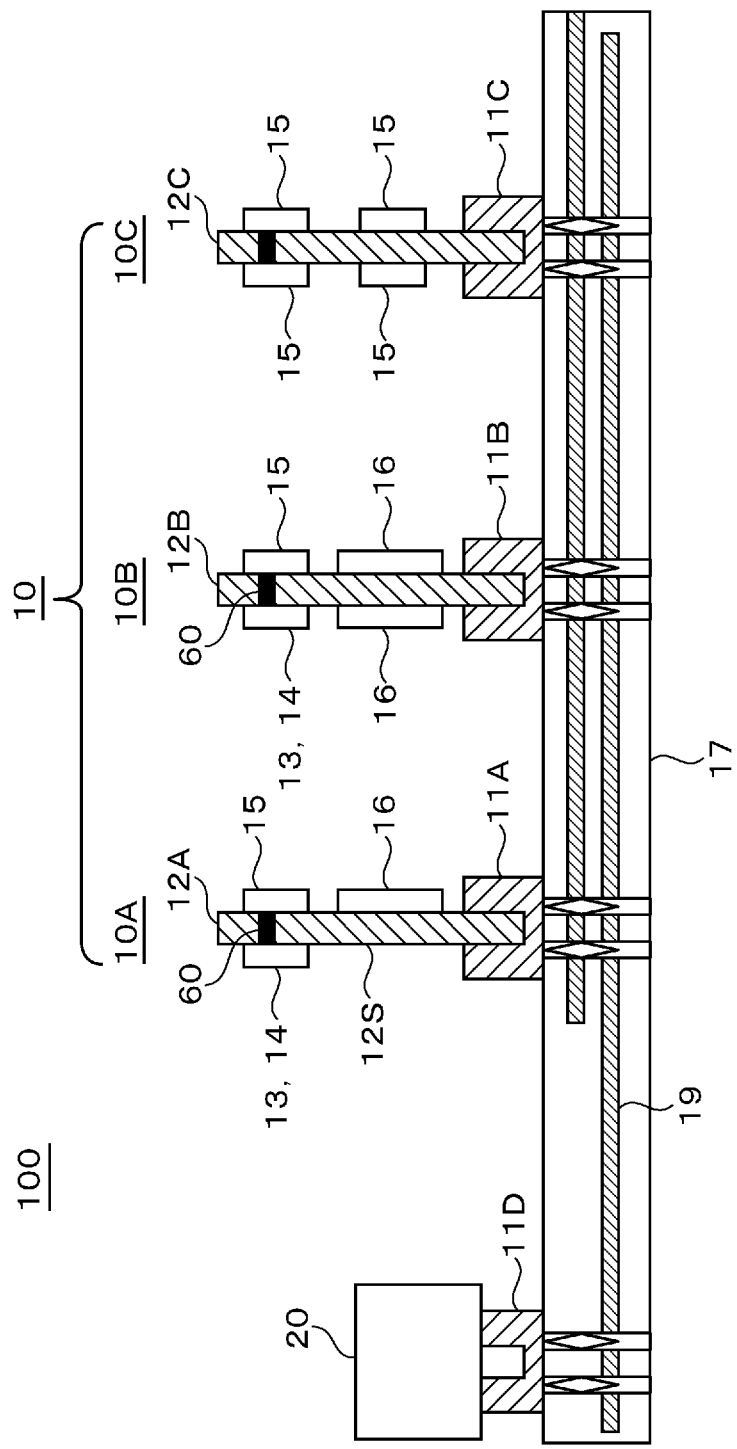

F I G. 2
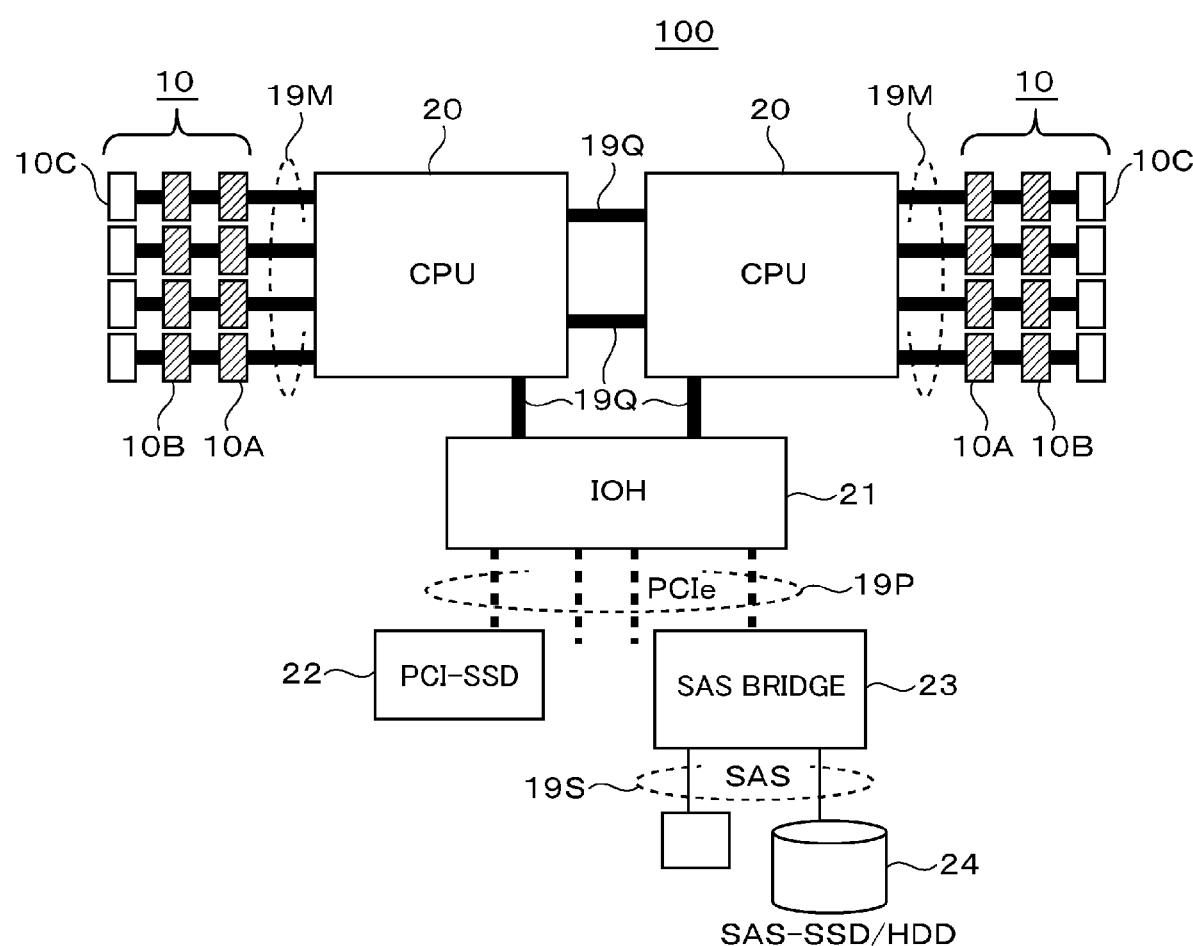

F I G. 3A
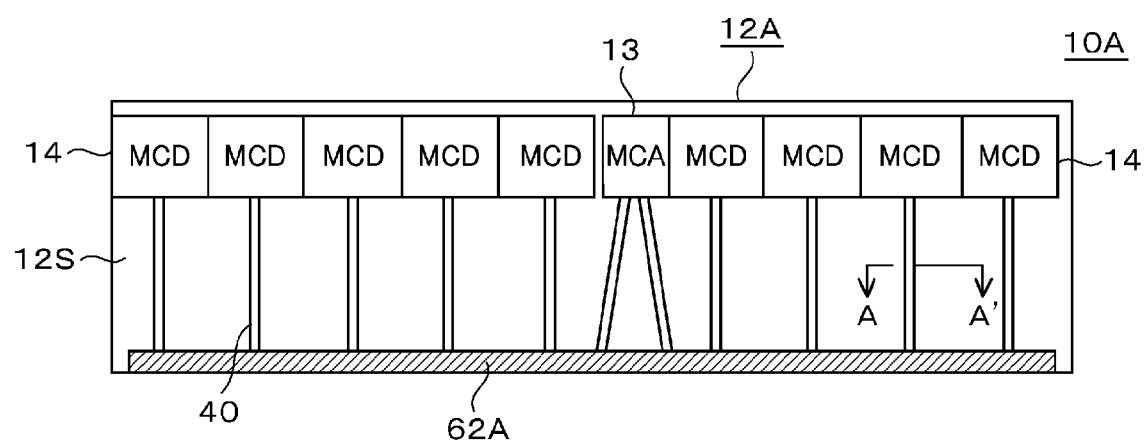

F I G. 3 B
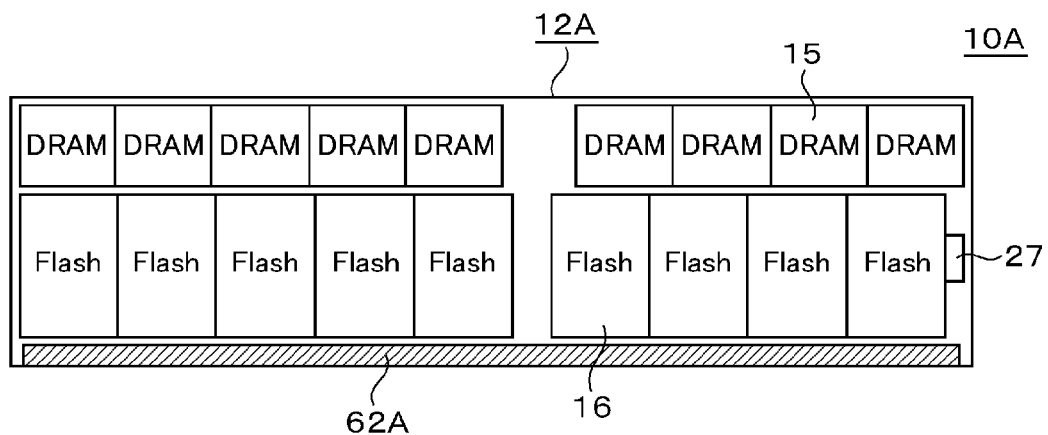

F I G. 4 A
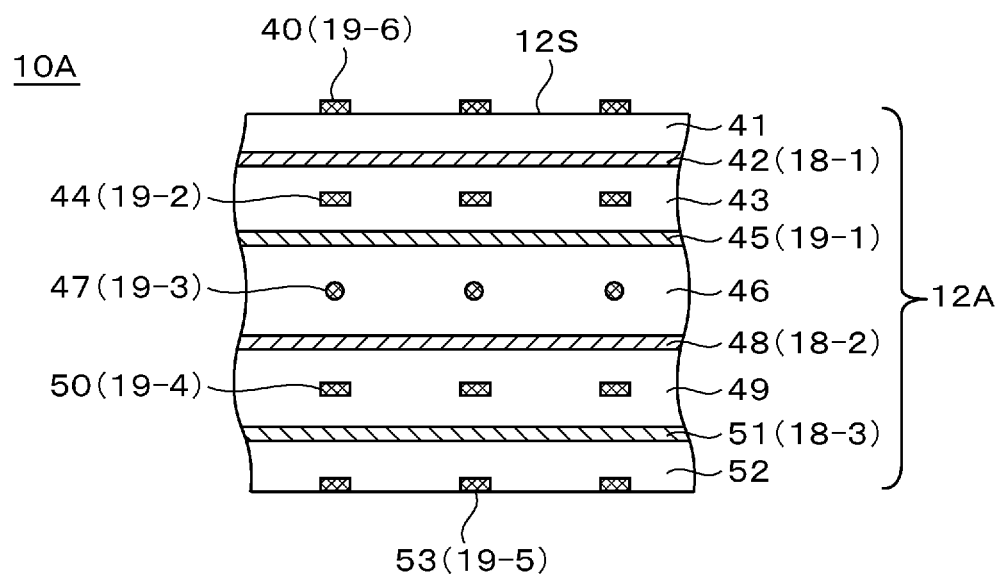

F I G. 4 B
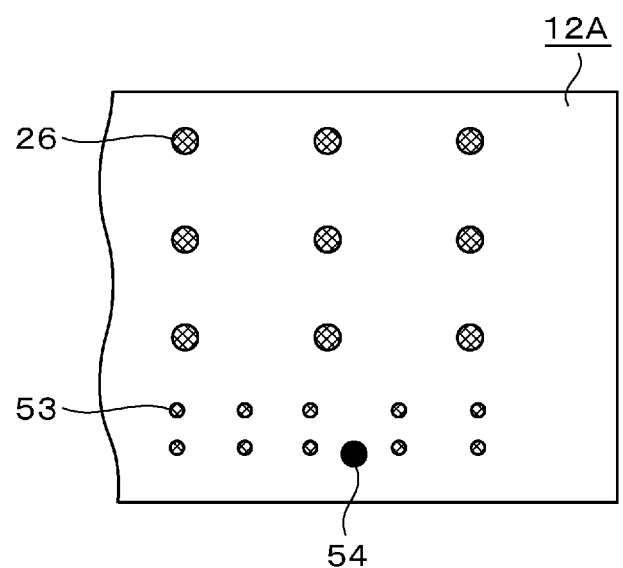

F I G. 5 A
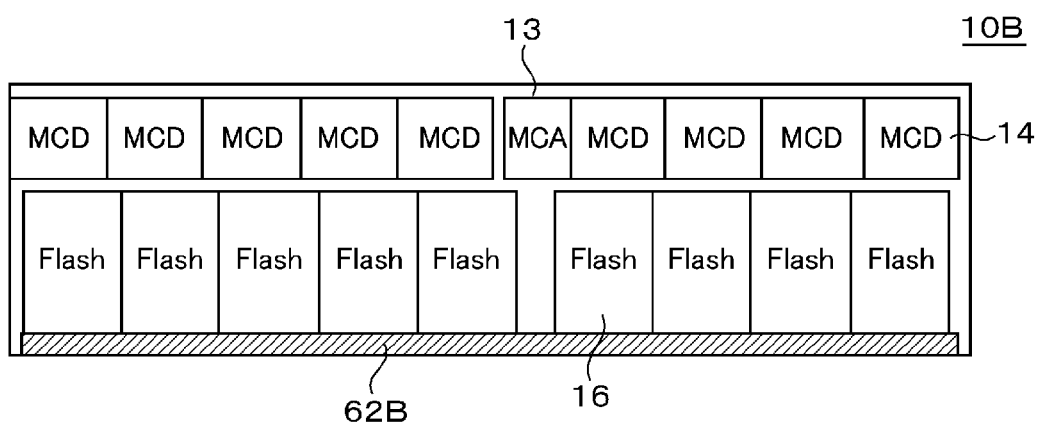

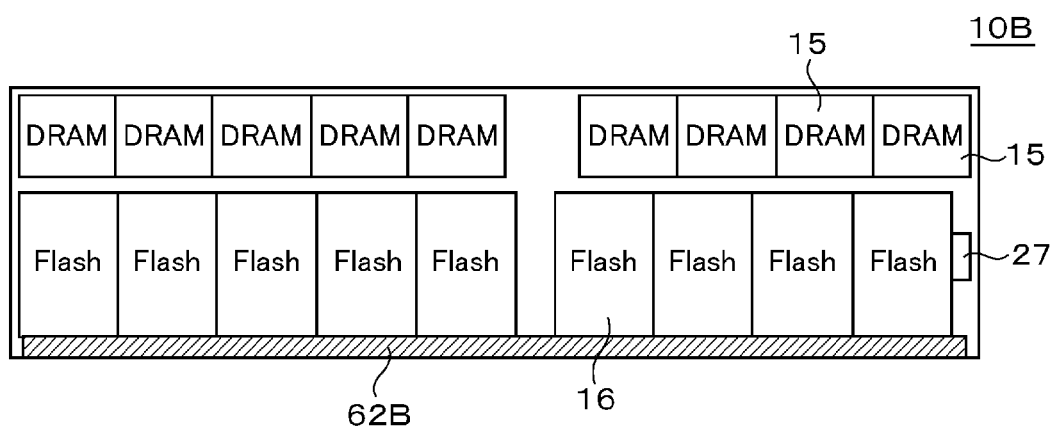
F I G. 5 B

F I G. 6A
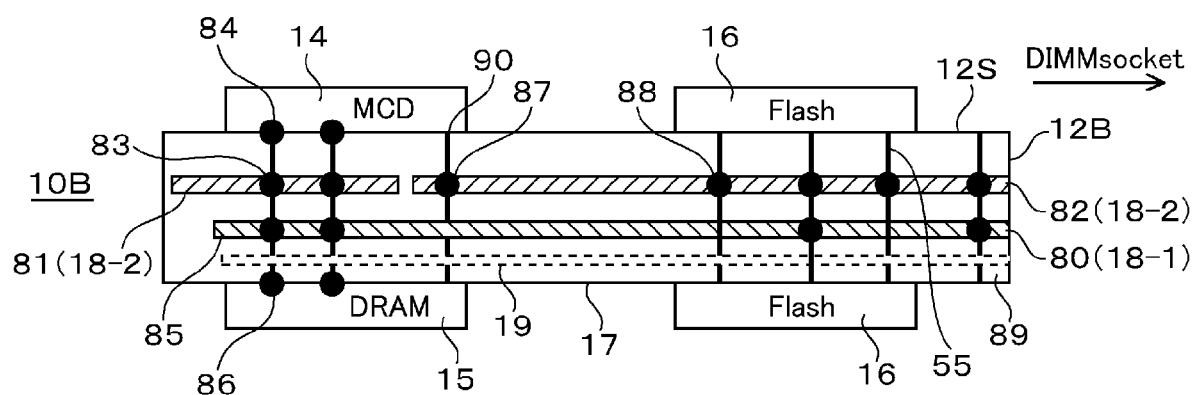

F I G. 6 B
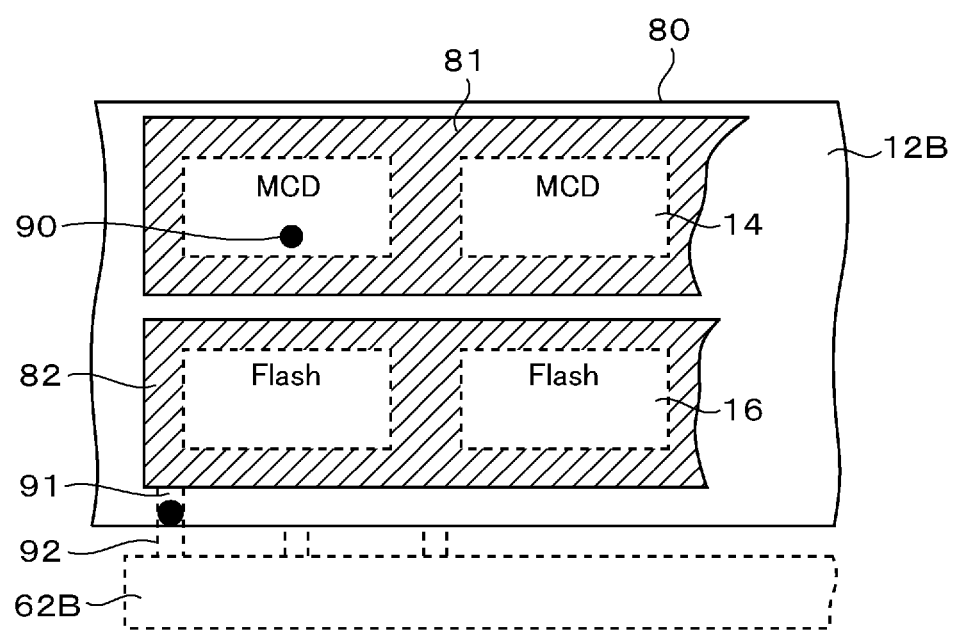

F I G. 8 A
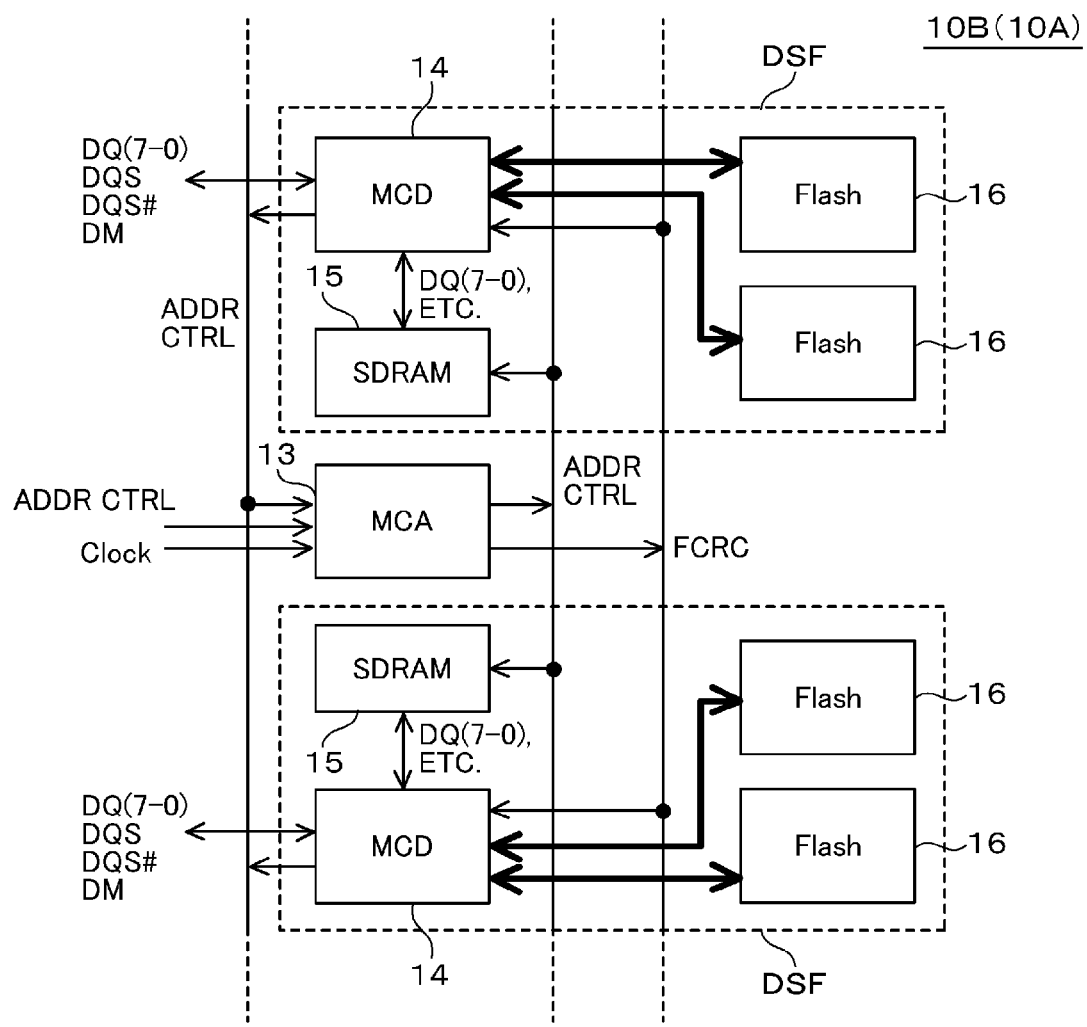

F I G. 8 B
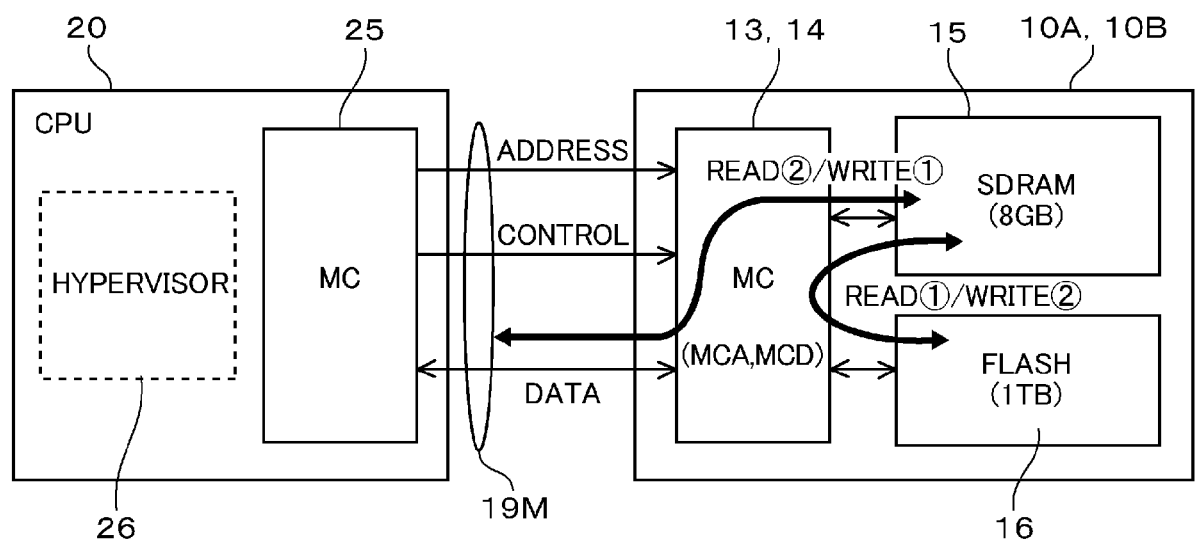

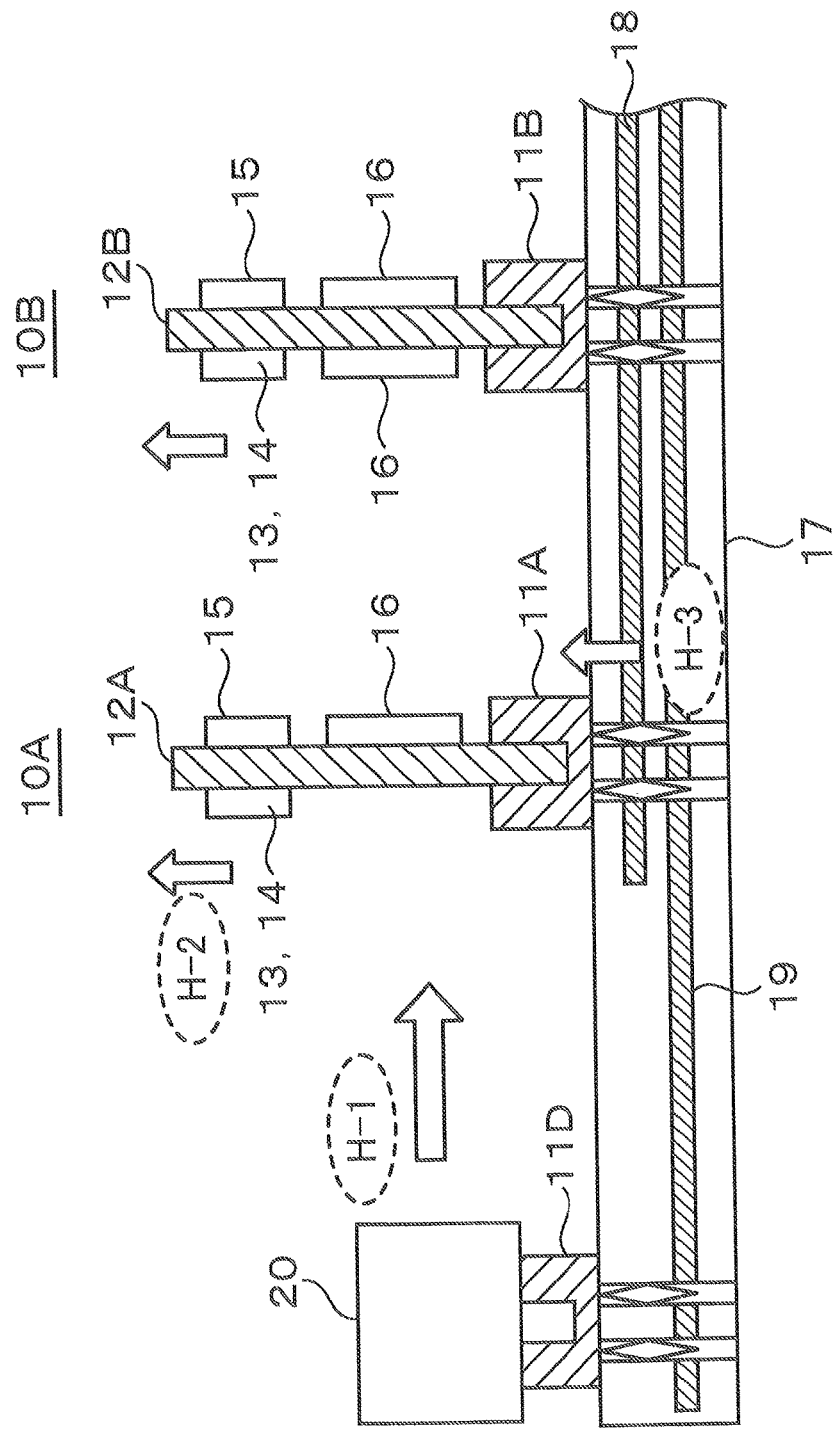

F I G. 1 0
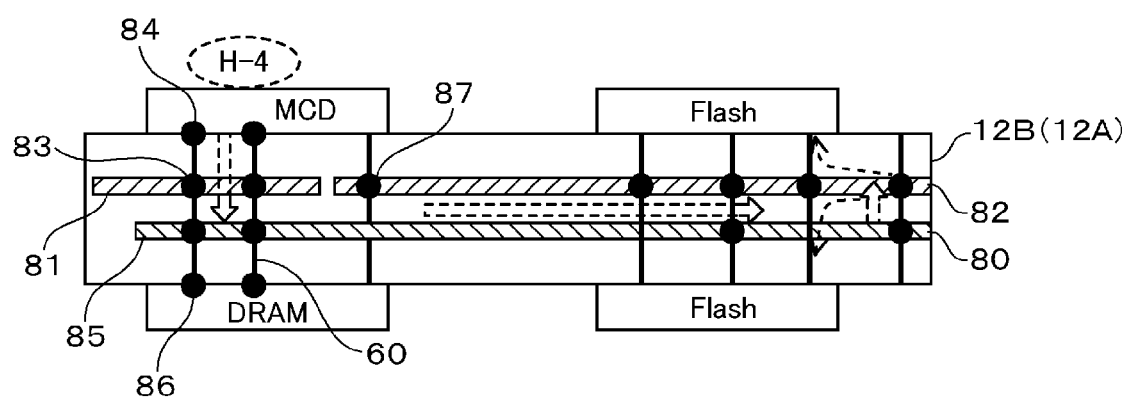

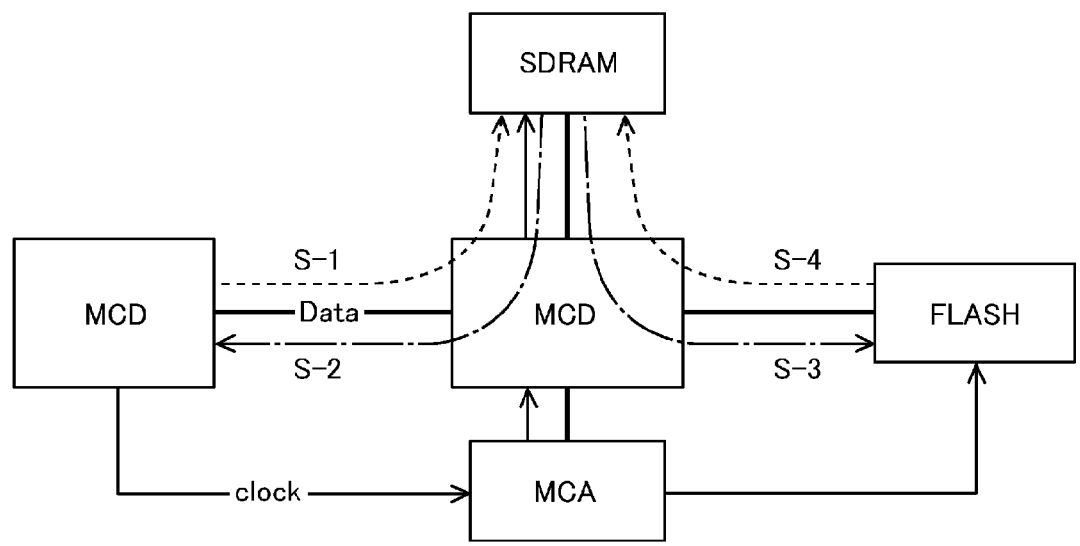
F I G. 1 1 A

F I G. 1 1 B
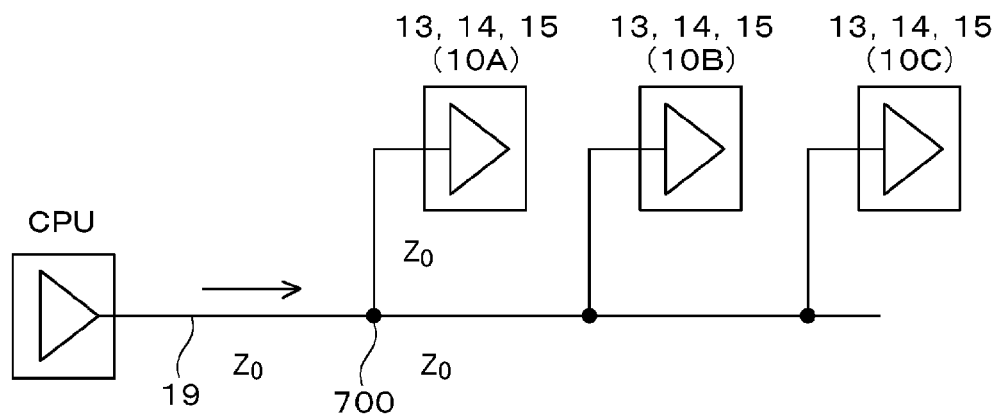

F I G. 1 2 A
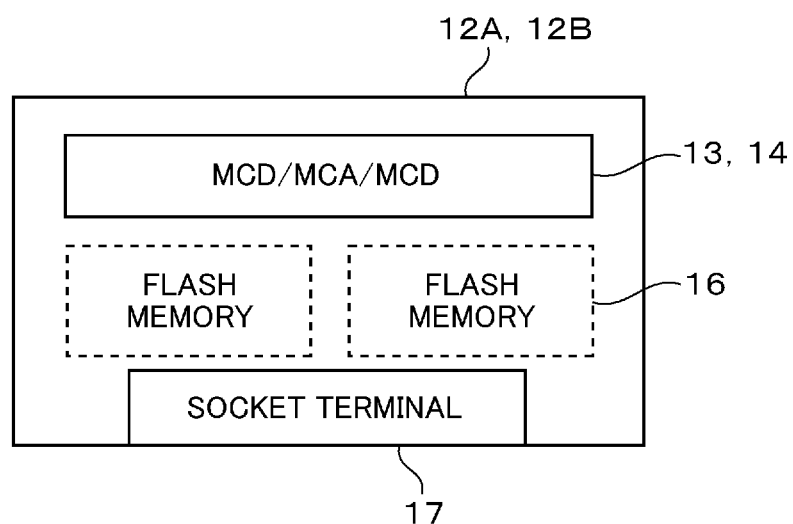

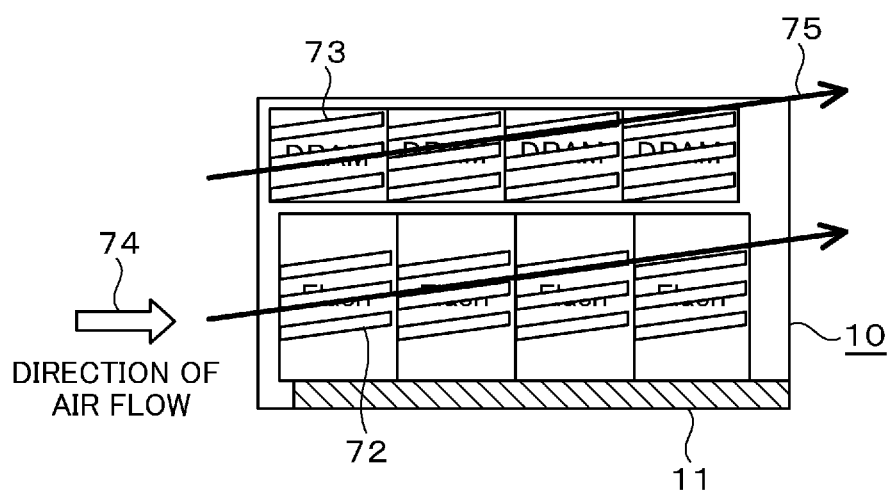
F I G. 1 4

MEMORY MODULE HAVING DIFFERENT TYPES OF MEMORY MOUNTED TOGETHER THEREON, AND INFORMATION PROCESSING DEVICE HAVING MEMORY MODULE MOUNTED THEREIN

TECHNICAL FIELD

The present invention relates to a memory module having different types of memory, such as a nonvolatile memory and a volatile memory with different transmission rates, mixedly mounted thereon, and an information processing device having the memory module mounted therein.

BACKGROUND ART

In the field of information processing devices like servers, there is a growing need for rapid access to large quantities of data, such as databases (DB), in the coming era of "big data". The trend toward enlarging main storage (DRAM) has yet to catch up with that need, in part because of the lagging 3D memory packaging technology (TSV). Besides, DRAMs have a difference in throughput (latency) on the order of $10^6$ to SAS (Serial Attached SCSI)-connected SSDs (Solid State Drive) or HDDs (Hard Disk Drive), which are auxiliary storage devices.

Now that PCI-connected SSDs (PCI-SSD) have been commercialized for offering response rates that fall response rates between the response rates of DRAM and the SAS-connected SSD (SAS-SSD), the market for this product is expected to grow in the future.

Patent Literature 1 discloses an FBDIMM (Fully Buffered DIMM) in which flash memories and DRAMs are mounted on different DIMMs (Dual Inline Memory Module) and connected in a daisy-chain manner of a serial transmission system via serial transmission buffer elements mounted on each module. A Memory controller is provided to transmit serialized control signals, address signals, and write data signals to the DIMMs and receive serialized read data signal from the DIMMs in accordance with the FBDIMM signal transmission protocol.

PRIOR ART DOCUMENTS

Patent Literature

PTL 1: JP-2010-524059-A

SUMMARY OF THE INVENTION

Problems to be Solved by the Invention

Although the throughput of the PCI-SSD is higher than that of the SAS-SSD, it is still lower than that of DRAM on the order of $10^3$. The throughput of reading data may be a bottleneck in calculation performance of such information processing devices as servers that process big data. To further improve the performance may conceivably require mounting inexpensive large-capacity memories on a CPU memory bus that offers the largest throughput band.

On the other hand, for example, it is conceivable to mount together DRAMs, which are a high-speed memory, and flash memories, which have lower speed and higher capacities than the DRAMs, on a DIMM. What matters in this case is how to arrange the mounted components in such a manner that the throughput of the CPU memory bus is not affected.

The flash memory is characterized by its tendency to have shorter service life as its ambient temperature becomes higher. Generally, the memory modules making up an information processing device are connected to numerous heat sources including the CPU. For this reason, when densely packed flash memories are in use, their ambient temperature is required not to exceed, for example, 60° C., and to be held between 40° C. and 55° C. or lower.

The above-mentioned characteristics of the memories are not taken into account by the invention disclosed in Patent Literature 1.

A subject of the present invention is to provide a memory module having different types of memories mixedly mounted thereon in a manner increasing the packaging density of flash memories to boost their performance while taking their temperature characteristics and the throughput of the CPU memory bus into consideration, and to provide an information processing device having the memory module mounted therein.

Means for Solving the Problems

Of the disclosures made in this description, the representative one is briefly explained as follows. A memory module having different types of memories mixedly mounted thereon includes a double-sided substrate having a first edge and a second edge opposite the first edge; a plurality of memory controllers; a plurality of flash memories; and a plurality of second memories having a higher signal transmission rate than the rate of the flash memories; wherein a socket terminal for connecting the double-sided substrate to a motherboard is formed on the first edge side of the double-sided substrate but on the front and the back surface of the double-sided substrate; wherein the memory controllers are disposed on the second edge side of the double-sided substrate; wherein the second memories are disposed on the second edge side of the double-sided substrate but at corresponding positions opposite the positions at which the memory controllers are disposed; and wherein the flash memories are disposed on at least the back surface of the double-sided substrate but at positions that are closer to the first edge rather than the memory controllers and the second memories.

Effects of the Invention

The present invention makes it possible to optimize the arrangement relations between heat-sensitive flash memories and heat-dissipating components to maximize the service life of a mixed memory module that includes the flash memories.

BRIEF DESCRIPTION OF DRAWINGS

FIG. 1 is a sectional side view showing a typical structure of an information processing device mounted with mixed modules each made of different types of memories according to a first embodiment of the present invention.

FIG. 2 is a plan view of a server according to the first embodiment.

FIG. 3A is a diagram showing the arrangement of components on the front surface of a first memory module according to the first embodiment.

FIG. 3B is a diagram showing the arrangement of components on the back surface of the first memory module according to the first embodiment.

FIG. 4A is a vertical cross-sectional view taken on line A-A' in FIG. 3A, showing a pattern of a double-sided printed circuit board.

FIG. 4B is a diagram showing a typical back surface of the first memory module corresponding to the layered pattern in FIG. 4A.

FIG. 5A is a diagram showing the arrangement of components on the front surface of a second memory module according to the first embodiment.

FIG. 5B is a diagram showing the arrangement of components on the back surface of the second memory module according to the first embodiment.

FIG. 6A is a cross-sectional view in a horizontal direction showing an intra-substrate structure of the second memory module according to the first embodiment.

FIG. 6B is a diagram showing a part in FIG. 6A as viewed from the front surface side.

FIG. 8A is a detailed block diagram showing an overall structure of a mixed memory module according to the first embodiment.

FIG. 8B is a block diagram showing the functionality of memory controllers in FIG. 8A.

FIG. 9 is a diagram explaining the heat-related behavior of and effects on the mixed memory modules according to the first embodiment.

FIG. 10 is a diagram showing an intra-substrate ground pattern of the memory module according to the first embodiment.

FIG. 11A is a diagram showing data and signal transmission paths on the memory bus between the CPU and the components (MCA, MCD, DRAM, and flash memory) mounted in each mixed memory module according to the first embodiment.

FIG. 11B is a diagram explaining the impedance relations between the CPU and the components mounted in each mixed memory module according to the first embodiment.

FIG. 12A is a block diagram showing a first mixed memory module and a second mixed memory module making up a second embodiment of the present invention.

FIG. 14 is a front view of the memory module in FIG. 13.

MODE FOR CARRYING OUT THE INVENTION

Figure 7:
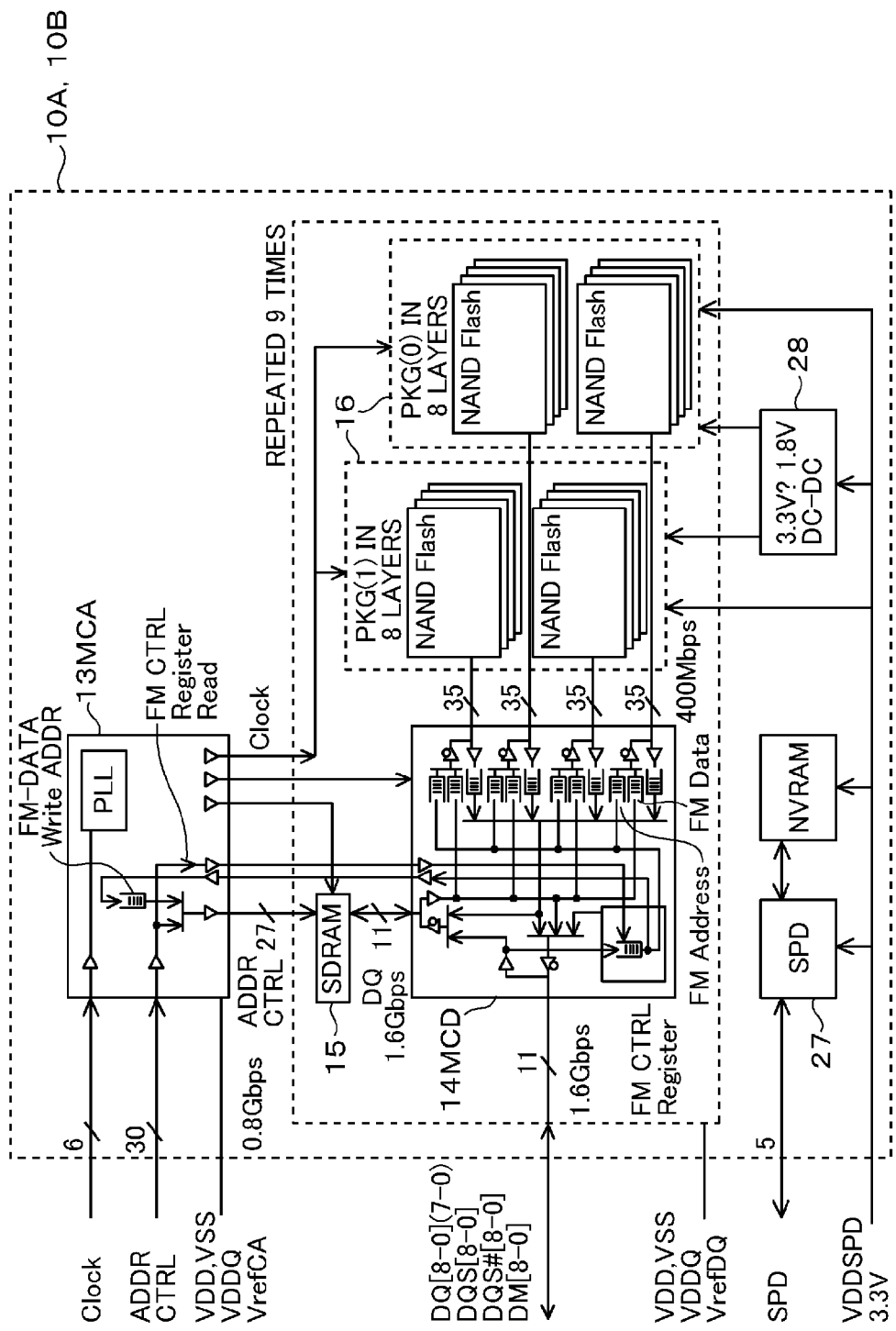
FIG. 7 is a block diagram showing a circuit structure of CPUs and mixed memory modules making up the server in FIG. 2.

In the present disclosure, the DRAM refer to a memory that are used in main storage and include a clock synchronous type DRAM (generically called SDRAM hereunder) such as a SDRAM (Synchronous DRAM) and other. The DIMM refers to a memory module that has multiple packaged memories and is used in the main storage (primary storage). The functionality, size, and pin assignments of the DIMM comply with the JEDEC standard. The memory bus refers to a bus that connects the CPU to the main storage and has a relatively large data bus width of, for example, 64 bits. No components other than the CPU and main storage are connected to the memory bus. The I/O bus is a bus that connects the CPU to input/output devices and auxiliary storage (secondary storage) and has a relatively narrow data bus width of, for example, 8 bits. The CPU includes an arithmetic unit (CPU core) and a memory controller that controls a cache memory and an external memory.

Although an embodiment of this invention will be explained below in the form of a server as a typical information processing device, the invention may also be applied to information processing devices other than the server, such as a PC (Personal Computer). Whereas an ECC-equipped memory module will be explained below as a typical memory module, the invention may also be applied to memory modules devoid of the ECC. The embodiments of the present invention will now be explained in detail with reference to the accompanying drawings.

First Embodiment

An information processing device carrying multiple mixed memory modules including different types of memories will be first explained as the first embodiment of the present invention. FIG. 1 is a side view of an information processing device 100 having double-sided printed circuit boards 12 (12A, 12B, 12C) mounted perpendicularly to a motherboard 17. Each double-sided printed circuit board (simply called the substrate hereunder) 12 is mounted with multiple mixed memory modules (DIMM) each including different types of memories and a CPU 20. In other words, multiple mixed memory modules (DIMM) 10 are disposed approximately at the same height as the CPU 20 in the horizontal direction.

In this example, the first through the third memory modules 10 (10A, 10B, 10C) are attached perpendicularly to DIMM sockets 11 (11A, 11B, 11C) mounted on the motherboard 17. The DIMM sockets 11A, 11B and 11C are each connected to a ground line 18 and a memory bus 19 inside the motherboard 17. A DIMM socket 11D at one end of the motherboard 17 is mounted with the CPU 20 provided with heat-dissipating fins. At the lower ends of the double-sided substrates for the first through the third memory modules inserted in the DIMM sockets are terminals for the sockets (DIMM socket terminals). In this embodiment, the number of memory modules mounted on the motherboard is three. Although there is no limit to the number of memory modules that may be configured, the memory module count needs to be smaller the higher the signal transmission rate. Preferably, the number of memory modules is three or four. The base material of the double-sided substrates may be FR4 (Flame Retardant Type 4), for example.

With this invention, when each memory module is inserted in the DIMM socket 11 of the motherboard 17, the surface of the double-sided substrate near (i.e., facing) the CPU 20 is defined as the front surface; the surface farther from the CPU 20 (i.e., opposite side) is defined as the back surface. Also, the double-sided substrate 12 has a first edge and a second edge opposite the first edge. The edge near the DIMM socket terminal is defined as the first edge. The edge, farther from the DIMM socket terminal, and on which the memory controllers and SDRAMs are mounted, is defined as the second edge.

The first and the second memory modules 10A and 10B are mounted with flash memories 16 and SDRAMs 15 (i.e., mixed memory modules). The third memory module 10C is an SDRAM memory module mounted with SDRAMs 15.

That is, the first mixed memory module 10A closest to the CPU 20 is provided with an address memory controller (MCA) 13 and a data memory controller (MCD) 14 disposed on the front surface of a substrate 12A, and an SDRAM (DRAM) 15 and a flash memory (Flash) 16 disposed on the back surface. The MCA 13, MCD 14 and the SDRAM 15 are disposed on the front and the back surfaces on the second edge side farther from the socket terminal on the substrate at positions opposite to one another, and are interconnected through via holes 60. The wiring in the printed circuit board will be discussed later. No component is mounted on a surface 12S which is on the substrate 12A of the first mixed memory module 10A and near the first edge, i.e., the surface corresponding to the flash memory at the back surface of the substrate 12A.

The second mixed memory module 10B is provided with an MCA 13 and an MCD 14 disposed on the front surface of the substrate 12B, and an SDRAM 15 and a flash memory 16 disposed on the back surface. The MCA 13, MCD 14 and the SDRAM 15 are disposed on the front and the back surfaces on the second edge side of the substrate at positions opposite to one another and are interconnected through via holes 60. Flash memories 16 are disposed on the front and the back surfaces of the substrate 12B near the first edge.

The third mixed memory module 10C farthest from the CPU 20 is an SDRAM memory module that uses 240-pin RDIMMs (Registered DIMM) composed of DDR3-SDRAMs complying with the JEDEC standard. The RDIMM is a DIMM in which an IC (Integrated Circuit) called a registered buffer on a DIMM substrate receives address and control signals and shapes and amplifies the received signals before distributing them to the configured SDRAMs. The configured SDRAMs 15 are mounted on the front and the back surfaces of the substrate 12C.

FIG. 2 is a plan view of the server 100 that uses the mixed memory modules 10 according to this embodiment. The server 100 includes two CPUs 20, multiple memory modules 10 disposed on the left and right sides of the CPUs 20, an IOH (Input Output Hub) 21, a PCI-SSD 22, a SAS (Serial Attached SCSI) bridge 23, and a SAS-SSD/HDD 24. The two CPUs 20 are interconnected via the IOH 21 and a QPI (Quick Path Interconnect) bus 19Q. The two CPUs 20 are each connected to a four-channel memory bus 19M. The data width of the memory bus 19M per channel is 8B (bytes) plus 1B (byte) of ECC data. The memory bus 19M may be connected to three memory modules 10 per channel. The IOH 21 is connected to the PCI-SSD 22 and SAS bridge 23 via a PCIe bus 19P. The SAS bridge 23 is connected to the SAS-SSD/HDD 24 via a SAS bus 19S.

In this embodiment, the two CPUs 20 are connected to eight mixed memory modules (DIMM) 10. That is, the memory bus 19M for the left-hand and right-hand CPUs 20 is connected to sixteen mixed memory modules (10A and 10B) and eight SDRAM memory modules 10C. The mixed memory modules 10A and 10B and the SDRAM memory modules 10C are each accessed by the CPUs 20 through an SDRAM memory interface. Alternatively, there may be a single CPU 20 making up the server 100.

Fans (not shown) are provided to supply cooling air toward the CPUs 20 and memory modules 10 from below as viewed in FIG. 2, the supply of cooling air being intended to cool the usage environment of the flash memories down to a range of 40° C. to 55° C. or lower.

FIG. 3A is a diagram showing the arrangement of components on the front surface of the first memory module 10A according to the first embodiment. FIG. 3B is a diagram showing the arrangement of components on the back surface of the first memory module 10A. FIG. 4A is a vertical cross-sectional view taken on line A-A' in FIG. 3A, showing a pattern of the substrate of the first memory module.

The first memory module 10A has the substrate 12A, a socket terminal 62A near the first edge on the front and the back surfaces of this substrate for the DIMM socket 11A, one MCA 13 and nine MCDs 14 near the second edge on the front surface of the substrate; and nine SDRAMs 15, nine flash memories 16, and one SPD 27 near the second edge on the back surface of the substrate. The MCA 13, MCDs 14, and SDRAMs 15 are disposed on the substrate surface on the second edge side farther from the socket terminal 62A. The flash memories 16 are disposed on the back surface of a substrate 51 near the socket terminal 62A.

The substrate 12A has a layered structure with signal lines 40 (memory bus 19-6) formed on the surface 12S, followed downward by an insulating layer 41, a ground layer 42 (first ground 18-1), an insulating layer 43, signal lines 44 (memory bus 19-2), a power layer 45 (memory bus 19-1), an insulating layer 46, data lines 47 (memory bus 19-3), a ground layer 48 (second ground 18-2), an insulating layer 49, signal lines 50 (memory bus 19-4), a ground layer 51 (third ground 18-3), an insulating layer 52, and signal lines 53 (memory bus 19-5) in this order.

In the first memory module 10A, the wiring layer on the front surface 12A of the substrate is used unmodified as a conductor path 40 connecting the socket terminal 62A to the MCA 13 and MCDs 14. This structure minimizes reflection across via holes and wiring layers, thus making it possible to transfer signals and data at high speed between the CPUs and the MCA 13 or MCDs 14. Where the MCDs 14 and SDRAMs 15 are mounted on the front and the back surfaces at positions overlapping with each other and interconnected over the shortest distances through via holes, signals and data are transferred at high speed between the two types of components. Although no SSTL terminating resistor is shown included in the drawing, that resistor may be provided interposed between the MCDs and the socket terminal. Alternatively, the functionality of the resistor may be incorporated in the MCDs. It should be noted that FIGS. 3A and 3B show only representative wiring.

In the first memory module 10A, the flash memories 16 are disposed only on the back surface of the substrate 12A. This arrangement reduces heat radiation from the CPUs 20, a high heat source, to the flash memories 16. These effects will be discussed later in detail.

FIG. 4B is a diagram showing a typical back surface 12S of the substrate 12A corresponding to the layered pattern in FIG. 4A. The external terminals (bump electrodes) on the substrate surface are formed by solder balls. The external terminals 26 on the upper side of the substrate are disposed at the same positions as the SDRAM balls. The external terminals (balls) 53 on the underside of the substrate are part of the signal lines connected to the external terminals of the flash memories 16. At the lower end of the substrate are balls connected to the socket terminal 62A. Reference numeral 54 indicates a ground line (via hole). Although only one representative via hole is shown in FIG. 4B, the via holes in practice are disposed so that the signal lines, power lines, and ground lines are provided at an approximate ratio of 3:1:1. Other than the signal lines 40, numerous signal lines that do not require high-speed transmission are formed threaded in the substrate made up of layered wiring.

FIG. 5A is a diagram showing the arrangement of components on the front surface of the second memory module 10B according to the first embodiment. FIG. 5B is a diagram showing the arrangement of components on the back surface of the second memory module 10B.

The second memory module 10B has a socket terminal 62B near the first edge on the front and the back surfaces of the substrate 12B; one MCA 13, nine MCDs 14, and nine flash memories 16 on the front surface of the substrate; and nine SDRAMs 15, nine flash memories 16, and one SPD 27 on the back surface of the substrate. The MCA 13, MCDs 14, and SDRAMs 15 are disposed on the surface near the second edge of the substrate and farther from the socket terminal 62B. In other words, the flash memories 16 are disposed on the front and the back surfaces of the substrate 51 below the SDRAMs 15.

In the server 100 shown in FIG. 2, a total of twenty seven flash memories are disposed in the first and the second mixed memory modules 10A and 10B. On each substrate, the MCA 13 is disposed with horizontally long, SDRAMs 15 are disposed also with horizontally long, and flash memories 16 are disposed with vertically long.

In the third memory module 10C, on the front surface of the substrate 12C, eighteen SDRAMs 15, one registered buffer IC and one SPD are mounted. On the back surface of the substrate 12C, eighteen SDRAMs 15 and one registered buffer IC are mounted. Of these components, two SDRAMs 15 on the front surface and two SDRAMs 15 on the back surface are for ECC data. That is, the third memory module 10C is an ECC-equipped 32 GB RDIMM handling data of 4 GB multiplied by 64 and ECC of 4 GB multiplied by 8. Alternatively, the third memory module 10C may be an LRDIMM (Load-Reduced DIMM) that also buffers data signals. In this case, the terminal assignments and terminal functions of the LRDIMM are the same as those of the RDIMM.

FIG. 6A is a horizontal cross-sectional view showing an intra-substrate structure of the second memory module 10B. In this drawing, the right-hand edge constitutes a socket terminal 62 to be inserted to the DIMM socket 11A. FIG. 6B is a diagram showing a part in FIG. 6A as viewed from the front surface side.

One of the features of this invention is that MCD/DRAM ground lines 80 and 81 are separated from a flash memory ground line 82. The separation is made possible by a ground plane serving as a wide conductor or a heat-conducting path. It should be noted that the ground line 81 is common to an MCD flash memory interface (I/F) and the flash memories. This structure is intended to ensure a signal line return path, which minimizes heat propagation to the flash memories, ensures signal quality, and enables high-speed transmission.

In the second memory module 10B, MCD/DRAM ground layers 80 and 81, a flash memory ground layer 82, and a memory bus line 19 are formed inside the motherboard 17. The MCDs 14 and DRAMs 15 are connected to the socket terminal 62 byway of connecting points 83, 84 and 85, the MCD/DRAM ground layer 81 (second ground 18-2), ground layer 80 (first ground 18-1), and via holes (not shown). The MCDs 14 and DRAMs 15 are also connected to the memory bus line 19 through via holes (not shown). Furthermore, the MCDs 14 are connected to one end of the flash memory ground layer 82 by way of via holes 87. That is, the ground line 81 is common to the MCD flash memory interface (I/F) and the flash memories. In this manner, the second ground 18-2 is separated into two ground layers 81 and 82 within the same layer of the same substrate. The flash memories 16 are connected to the socket terminal 62B by way of connecting points 88, ground layer 82 (second ground 18-2), and via holes 91.

The first memory module 10A is the same as the second memory module in terms of the MCD/DRAM ground line being separated from the flash memory ground line. The difference between the first memory module 10A and the setup in FIG. 6A is that there is no flash memory 16 on the same plane as the MCDs 14.

FIG. 7 shows an overall structure of the mixed memory modules according to the first embodiment. As shown in FIG. 7, the mixed memory modules 10A and 10B each include an MCA 13, an MCD 14, an SDRAM 15, and multiple flash memories 16. The MCA 13 and MCD 14 make up a memory controller MC (see FIGS. 8B, 13, and 14). MCDs 14, as many as the number of configured SDRAMs 15, are mounted in each of the mixed memory modules 10A and 10B. One MCA 13 is mounted in each of the mixed memory modules 10A and 10B. The MCA 13 and MCD 14 are each formed by a semiconductor chip in a BGA package. The 64 GB flash memory 16 has eight 8 GB NAND flash memory chips (NAND Flash) layered and disposed in a single BGA package.

The mixed memory modules 10A and 10B each also have an SPD (Serial Presence Detect) 27 and a DC-DC converter 28. The SPD 27 stores information about the memory module itself (e.g., the type and structure of memory chips, memory capacity, and presence or absence of ECC and parity). The DC-DC converter 28 generates a line voltage for the flash memories 16.

The mixed memory modules 10A and 10B each further have a socket terminal for connecting to the memory bus line 19M. The socket terminal is fed with a clock signal (Clock), an address signal (ADDR), a control signal (CTRL), a data signal (DQ), a data control signal (DQS, DQS#, DM), a power source (VDD, VSS, VDDQ, VrefDQ), and an SPD signal. The signals needed for access from the socket terminal to the SDRAMs and flash memories are first input to the MCA 13 or MCD 14.

In the MCA 13, a first clock signal (Clock) is input to a PLL (Phase Loop Lock) circuit. In turn, the PLL circuit outputs a second clock signal (CKF, CKF#) for the flash memories, a third clock signal (CKMD) for MCA data, and a fourth clock signal (CK, CK#) for the SDRAMs. The first clock signal (Clock), the third clock signal (CKMD), and the fourth clock signal (CK, CK#) have the same frequency. The second clock signal (CKF, CKF#) has one-fourth of the frequency of the first clock signal (Clock).

The address signal (ADDR) and control signal (CTRL) are input to a selector of the MCA 13. In turn, the selector outputs a control signal (ADDR CTRL) for the SDRAMs. This control signal is used to write flash memory data to the SDRAMs or SDRAM data to the flash memories.

As shown in FIG. 8A, the MCA 13 is preferably midway between the memory modules 10A and 10B. A portion DSF enclosing one data memory controller MCD 14, one SDRAM 15, and two flash memories 16 with broken lines is repeated five times above the MCA 13 and four times below the MCA 13, for example (in FIG. 8A, only one portion DSF is shown above the MCA 13 and another below the MCA 13).

FIG. 8B is a block diagram showing the CPU 20 and mixed memory modules 10A and 10B making up the server 100. The CPU 20 incorporates a memory controller 25 for controlling the memory modules 10A, 10B and 10C. The memory controller 25 is in turn controlled by a hypervisor 26. The CPU 20 further incorporates a cache memory, not shown, which stores data read by the memory controller 25 from the memory modules 10A, 10B and 10C. Memory controllers 13 and 14 interface the memory bus 19M with the SDRAMs 15 and flash memories 16.

In FIG. 8B, data is read from the flash memories 16 in the mixed memory modules 10A and 10B as follows (READ operation): The memory controllers 13 and 14 first read data from the flash memories 16 and writes the read data to the SDRAMs 15. Thereafter, the memory controllers 13 and 14 read the data from the SDRAMs 15.

In the route (READ (i)) where data is read from the flash memories 16 and written to the SDRAMs 15, the data is not routed through the memory bus 19M. Only in the route (READ(ii)) where data is read from the SDRAMs 15, the data is routed through the memory bus 19M. In this manner, data throughput is maximized to the limit of the memory bus capacity.

Also, when data is written to the flash memories 16 in the mixed memory modules 10A and 10B (WRITE operation), the memory controllers 13 and 14 first write the data to the SDRAMs 15 (WRITE(1)). Thereafter, the memory controllers 13 and 14 read the data from the SDRAMs 15 and write the read data to the flash memories 16 (WRITE(2)). That is, when data is written to the flash memories 16, the data is not routed through the memory bus 19M. Instead, the data is read from the SDRAMs 15 and written to the flash memories 16. In this manner, data throughput is maximized to the limit of the memory bus capacity.

Because the CPU 20 performs memory management in the mixed memory modules 10A and 10B in the manner described above, delays attributable to the memory controllers 13 and 14 is minimized.

The hypervisor 26 runs directly on hardware. All operating systems (OS) operate on the hypervisor. Applications run on the OS. The hypervisor provides the address space of the server including virtual machines (VM). An address of a buffer cache secured by the application is assigned to suitable addresses by the OS.

The flash memories in a mixed memory module 10FD are in an I/O space. This arrangement requires allocating the address of the data read from the flash memories in the I/O space to a physical address in the memory address space. An address translation function of the hypervisor allocates the addresses of the buffer cache secured by the application to the SDRAMs inside the mixed memory module (DIMM). This function enables data transmission inside the mixed memory module while preventing extra data transmission to the memory bus.

As discussed above, the higher their ambient temperature is, the flash memories tend to be shorter in service life. This means temperature control over flash memories is necessary. The major causes of temperature rise are (1) heat-dissipating air flow from the CPUs, and (2) heat generation by the MCDs and MCAs. The heat-generating components are not limited to these parts; other heating elements include power-consuming parts, such as ASICs and FPGAs, as well as power supply modules. In order to maximize the service life of the components in the mixed memory module, it is necessary to optimize the arrangement relations between the heat-sensitive flash memories and the heat-dissipating elements.

FIGS. 9 and 10 are diagrams explaining the heat-related behavior of and effects on the mixed memory modules according to this embodiment. For this embodiment, it is assumed that multiple mixed memory modules are disposed horizontally in a manner interposing the CPUs 20 inside the server 100 as shown in FIG. 2. The major heat-generating components in the server 100 are the CPUs 20, MCDs 14, MCAs 13, and DRAMs 15. In particular, the CPUs generate heat the most.

In this embodiment, as shown in FIG. 9, the first mixed memory module positioned closest to the CPU 20 has only the MCA 13 and MCD 14 disposed on the front surface of the substrate 12A, and has the DRAM 15 and flash memory 16 disposed on the back surface of the substrate. That is, since those positions on the front surface 12S of the substrate 12A which are near the DIMM socket 11A receive radiant heat (H-1) directly from the heat-generating CPU, it is not preferable to dispose flash memories at such positions in view of their vulnerability to heat. For this reason, no component is disposed at these positions, except in the conductor path 40. The back surface of the substrate, however, is not subject to radiant heat from the CPU, so that the flash memories 16 may be disposed here with no adverse effects on their heat-dissipating characteristics.

Because heat propagates upward, the flash memory should not be disposed above the heat-generating components (MCA, MCD and DRAM). That is, although convection (updraft) is generated by the MCA 13, MCD 14 and DRAM 15 generating heat (H-2) in the ambient air, the flash memory is located below the MCA 13, MCD 14 and DRAM 16, so that the heat-dissipating characteristics of the flash memory are not affected by the generated heat (H-2).

There also exists heat (H-3) that is propagated to the flash memory by way of the ground pattern of the motherboard 17 and the socket terminal 62. However, since the heat transfer path involved is extensive, the effects of this heat (H-3) are negligible compared with the other heat (H-1 and H-2).

The second mixed memory module 10B has the MCA 13 and MCD 14 disposed on the front surface of the substrate 12B, and has the SDRAM 15 and flash memories 16 disposed on the back surface of the substrate. Since both the front and the back surfaces of the second mixed memory module 10B are not subject to the radiant heat from the CPU, the flash memories 16 may be disposed on the two surfaces of the substrate. Still, in order to avoid the effects of the heat (H-2) generated by the MCA 13, MCD 14 and SDRAM. 15, the flash memories are disposed below these components on the side of the DIMM socket 11A, whereby the heat-dissipating characteristics of the flash memories are ensured.

There is a possibility that the heat from the MCDs 14 and DRAMs 15 may propagate to the flash memories 16 through the intra-substrate ground pattern. FIG. 10 is a diagram showing the ground pattern in the substrates 10A and 10B of this embodiment. Here, the propagation of the heat (H-4) from the MCD 14 to the flash memories 16 through the ground pattern is prevented by the second ground layer 18-2 at the same height being divided into the ground later 81 for the MCD 14 and the ground layer 82 for the flash memories 16. The MCD 14 and DRAM 15 are connected to the socket terminal by means of connecting points 83 through 86, the overall ground layer 80 (first ground 18-1) and via holes (not shown). The flash memories 16 are connected to the socket terminal by way of connecting points 88, the ground line 82 (second ground 18-2), and via holes 91. In this manner, the second ground 18-2 inside the substrate is divided into two portions that are each connected to the MCD 14, DRAM 15, and flash memories 16. This structure prevents the heat (H-4) generated by the MCD and DRAM from propagating to the flash memories through the intra-substrate ground pattern. Because the first ground 18-1 composed of a single conductor plate having a large plane is disposed in parallel with and close to the separated second ground 18-2, a return current flows to the first ground 18-1. With the second ground 18-2 separated, the effects of discharge noise caused by high-frequency signals are reduced.

The ground line is common to the flash memory interface (I/F) of the MCD 14 and the flash memories at the left-hand edge. However, in terms of heat propagation, very little heat (H-4) is propagated as indicated by arrowed broken lines because the distance between the MCD 14 and DRAM 15 on the one hand, and the flash memories 16 on the other hand constitutes a prolonged path spanning three ground lines and multiple via holes.

This embodiment also takes into consideration the improvement of CPU memory bus throughput. Explained below with reference to FIGS. 11A and 11B is data read/write throughput that significantly contributes to the computing power of information processing devices, such as servers.

FIG. 11A shows data and signal transfer paths on the memory bus 19 between the CPU 20, and the components (MCA, MCD, DRAM, flash memory) disposed in each of the mixed memory modules 10A and 10B.

As discussed above with reference to FIG. 4A, the first mixed memory module 10A has the wiring layer on the front surface 12F of the substrate used unmodified as the conductor path 40 connecting the socket terminal 62A to the MCA 13 and MCDs 14. For example, the socket terminal 62A and each MCD 14 are connected by eleven data lines and thirty address lines, while the socket terminal 62A and the MCA 13 are connected by two clock lines and thirty address lines. Since no via holes are disposed halfway along the conductor path 40 (on the surface) formed over the substrate surface 12F, there is no disturbance in impedance. This enables high-speed transmission of the clock signals and data (S-1, S-2, Data) shown in FIG. 11A. For example, the data lines permit 1.6 Gbps data to be transferred at high speed between the CPU 20 and the MCD 14. Since the MCD 14 and the SDRAM 15 are interconnected approximately over the shortest distance between the front and the back surfaces of the substrate, signals and data can be transmitted at high speed between the two components. By contrast, the transmission of signals and data (S-3, S-4, Data) between the flash memory 16 on the one hand and the MCA 13, MCD 14, and SDRAM 15 on the other hand is allowed to be relatively slow, and so is the transmission of addresses between the configured components. For this reason, these signals, data, and addresses are transmitted by use of intra-layer wiring inside the substrate.

In the first mixed memory module 10A, the wiring layer 40 on the front surface 12F of the substrate, used unmodified as the conductor path 40 toward the MCA 13 and MCDs 14, ensures the good signal properties, which in turn make high-speed data and signal transmission more reliable than ever.

Further, FIG. 11B is a diagram explaining the impedance relations between the CPU 20, and the components mounted in each of the mixed memory modules 10A, 10B and 10C over the memory bus 19.

Generally, the memory bus 19 leading from the CPU 20 to the MCDs and other components of the mixed memory modules 10A, 10B and 10C is set to have the same thickness (impedance $Z_0$). At each branch point 700, the impedance is (½) $Z_0$ in equivalent terms. If the number of mixed memory modules is assumed to be three, the first mixed memory module is subject to the largest amount of signal reflection and is thus affected by noise, whereas the third mixed memory module is not much affected by noise. In the first mixed memory module 10A of this embodiment, the wiring layer on the front surface 12F of the substrate is used unmodified as the conductor path to the MCA 13 and MCD 14. This means that although the branch points are subject to a large amount of reflection, the good signal properties of the conductor path 40 contribute to making high-speed data and signal transmission more reliable than before. Since the transmission of signals and data (S-3, S-4, Data) between the flash memory 16 on the back surface of the substrate, and the MCA 13 and MCD 14 is allowed to be relatively slow in the first mixed memory module, these signals and data are transmitted by use of intra-layer wiring inside the substrate.

The second and the third mixed memory modules are subject to a smaller amount of signal reflection. In such a case, the flash memories disposed on the front surface of the substrate, with signals and data transmitted by use of intra-layer wiring, give rise to few adverse effects.

According to this embodiment, the first and the second mixed memory modules equipped with flash memories improves CPU memory bus throughput by utilizing the conductor path on the front surface of the substrate while taking the temperature characteristics of the flash memories into consideration.

In the information processing device 10 having multiple DIMMs (10A, 10B, 10C) mounted perpendicularly to the socket 11 of the motherboard 17 as discussed above, the flash memories are packaged more densely to boost its performance while the arrangement relations between the heat-sensitive flash memories and the heat-dissipating elements are optimized in order to maximize the service live of the components constituting the mixed memory modules.

Second Embodiment

Depending on usage environment of flash memories, there may be a case in which even a first mixed memory module is vulnerable only limitedly to effects of radiant heat from a CPU. In that case, the flash memories can be disposed on the front surface of a first mixed memory module. However, heat emanating from heat-generating elements (MCA, MCD and DRAM) mounted on the same module needs to be taken into account.

Thus in the second embodiment, as shown in FIG. 12A, the flash memories are disposed on the front and the back surfaces of the first and the second mixed memory modules on the first edge side. Although convection (updraft) occurs when the ambient air is heated by an MCA 13, MCD 14, and DRAM 15 on the second edge side, the flash memories are disposed under these components so that the heat dissipation characteristics of the flash memories are not affected by the heat. This in turn maximizes the service life of the components making up the mixed memory modules.

Third Embodiment

Figure 12B:
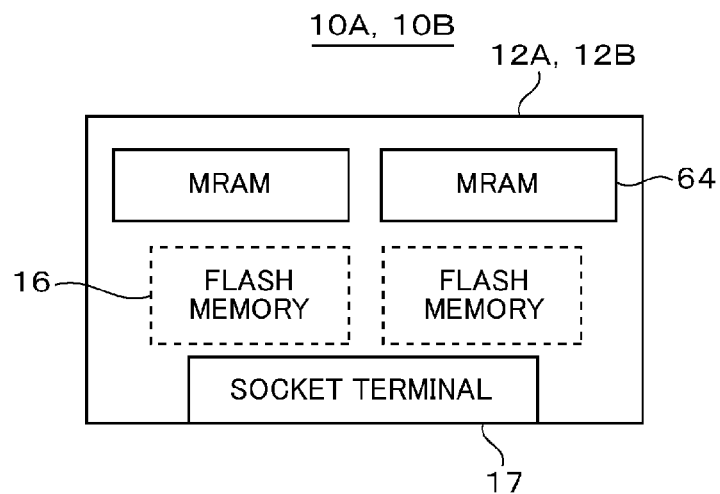
FIG. 12B is a block diagram showing a first mixed memory module and a second mixed memory module making up a third embodiment of the present invention.

The first and the second embodiments have been explained above as high-speed memories through the use of an SDRAM (DRAM) as examples. Other alternative types of high-speed memory may be an MRAM (Magnetic Random Access Memory), STT (Spin Transfer Torque)-RAM, and phase-change memory, as shown in FIG. 12B as a third embodiment. The SDRAM is also an example of nonvolatile semiconductor memory that does not retain data when power is removed. Furthermore, although the flash memories have been discussed above as nonvolatile memories, the nonvolatile memories are not limited to the flash memories. The present invention can also be applied to any semiconductor memories which can store more data than high-speed memories and which may have their service life shortened in a high-temperature usage environment.

Fourth Embodiment

In order to raise the packaging density of flash memories, there also is a need for mounting them on the front surface of a first mixed memory module (DIMM) in the usage environment in which the mounted flash memories are subject to radiant heat from a CPU. A fourth embodiment of the present invention thus involves using metal stoppers-cum-heat-dissipating fins that protect from the heat of the CPU the flash memories disposed on the front surface of the first mixed memory module on the socket side. The socket has stoppers that interpose a DIMM from the front and back of the substrate in a manner securing the module. The external surface of the stoppers is provided with a heat-dissipating fin structure. Inside the heat-dissipating fin structure is a flat plane that is in contact with the flash memories. When a cooling fan is used to feed air to cool the heat-dissipating fins in contact with the flash memories, the rise in the ambient temperature of the flash memories can be held within a tolerable range of temperatures.

As another example, the DIMM socket may be provided as a cover-equipped socket that shields the DIMM against the radiant heat from the CPU. That is, covers-cum-heat-dissipating fins are provided on the CPU side of the DIMM socket of the first mixed memory module (DIMM) in a manner covering the front surface of the flash memories. This structure allows the covers to block the heat from the CPU when the DIMM is inserted in the socket. In the event that the DIMMs are to be mounted on both sides of the CPU, the cover structure is provided only on the front surface facing the CPU of each module.

As yet another example, the surfaces of the flash memories may be painted white or mirror-equipped to provide a high reflection factor thereby suppressing the heat radiating from the CPU and other heat-generating components. As a further example, the above-described covers-cum-heat-dissipating fins on the CPU side may be painted white or mirror-equipped. As a yet further example, the surfaces of the flash memories may be given a corrugated rib-equipped fin structure that enhances the heat dissipation performance.

Fifth Embodiment

The above-described embodiments are a mixed memory module provided with different types of memories and having a double-sided substrate mounted perpendicularly to the motherboard. Alternatively, the present invention may be applied to an information processing device 100 in which DIMMs (10A, 10B, 10C) are mounted horizontally to a socket 11 of a motherboard 17. In other words, a CPU 20 can be attached to the top edge of the motherboard 17 extending vertically while multiple stages of mixed memory modules (DIMM) may be attached horizontally to the underside of the motherboard 17. That is, as a variation on each of the above-described embodiments, there may be provided mixed memory modules having their double-sided substrates mounted in multiple stages under the CPU 20 and in a horizontal relation to the motherboard. In this case, if the front surface of a first mixed memory module 10A is arranged to be near the CPU, flash memories 16 may not be disposed on the front surface as in the first embodiment.

Figure 13:
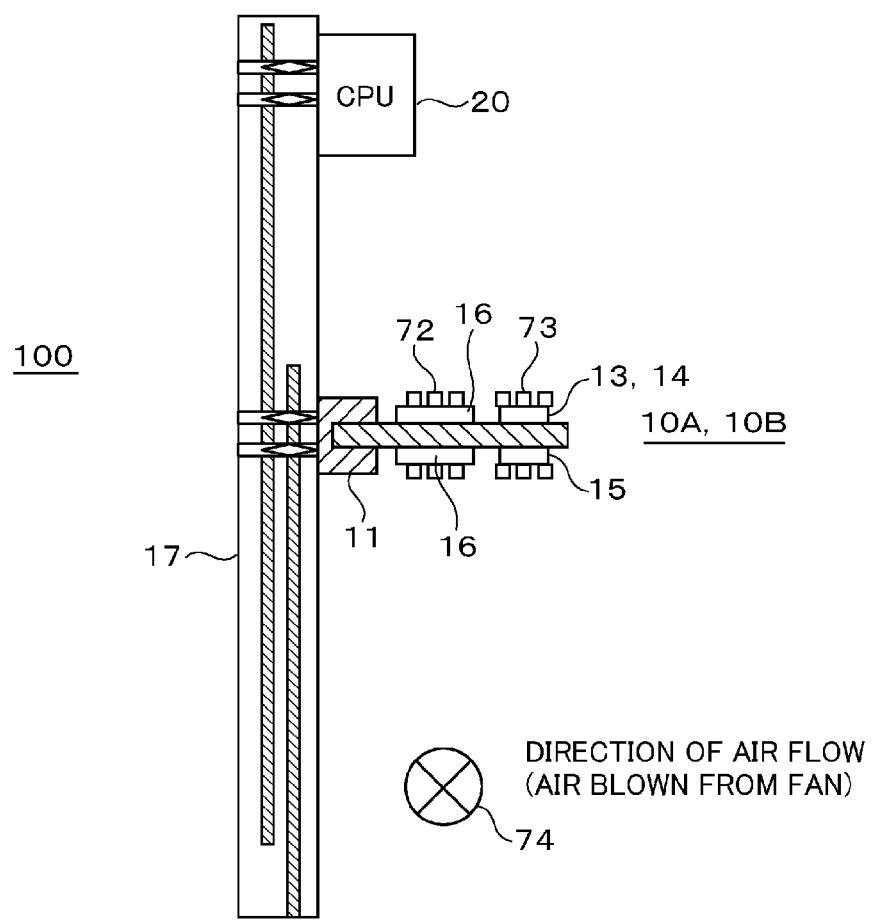
FIG. 13 is a side view of an information processing device having double-sided substrates mounted horizontally on a motherboard and making up a fifth embodiment of the present invention.

A fifth embodiment of this invention relates to an information processing device 100 in which the DIMMs (10A, 10B, 10C) are mounted horizontally to the socket 11 of the motherboard 17. FIGS. 13 and 14 show typical structures of the information processing device 100 carrying the mixed memory modules (DIMM) of this embodiment. FIG. 13 is a side view of the information processing device 100 having double-sided substrates 12 mounted horizontally on the motherboard 17. Each double-sided substrate 12 is mounted with mixed memory modules.

In this embodiment, the first through third memory modules 10 (10A, 10B, 10C) are mounted horizontally to a DIMM socket 11b attached to the motherboard 17 extending in the vertical direction. A ground line and memory bus line inside the motherboard 17 are structured the same as those discussed in the first embodiment.

In the information processing device of this embodiment, the CPU 20 as a heat-generating component of the DIMM is disposed at the highest position of the motherboard 17 that extends in the vertical direction. Under the CPU 20 are the DIMMs (10A, 10B, 10C) disposed horizontally. The flash memories 16 are disposed near a DIMM socket 11A on the front and the back surfaces of the substrate, and heat-generating components (MCA 13, MCD 14 and DRAM 15) are disposed away from the DIMM socket 11A. As discussed above in the fourth embodiment, the flash memories 16 have their surfaces equipped with heat-dissipating fins (corrugated ribs) 72. On top of that, the MCA 13, MCD 14, and DRAM. 15 have their surfaces provided with heat-dissipating fins (corrugated ribs) 73. Reference numeral 74 indicates the direction of air blown from a cooling fan, i.e., the direction of the cooling air flowing from the near side to the far side. This direction corresponds to that, in the plan view of FIG. 2 showing the information processing device 100, the air from the cooling fan is fed from the underside of the view toward the CPUs and memory modules.

FIG. 14 is a front view of the memory module 10 in FIG. 13. The heat-dissipating fins 72 and 73 have a positive gradient 75 that rises gently from the flash memory section on the windward side toward the leeward side. In this manner, the corrugated ribs are arranged at a predetermined angle to the horizontal direction as the means for forcibly directing the flow of cooling air by use of the cooling fan so that heated air (radiant heat air) propagates toward the upper side of the DIMM, with the flash memories 16 shielded against the heated air coming from the CPU 20, DRAM 15, MCA 13, and MCD 14. As another means for forcibly directing the cooling air flow, the heat-dissipating fins 72 and 73 may be replaced with a pair of cooling fans and guides that will cause the heated air (radiant heat air) forcibly to flow from the flash memories on the windward side toward the upper side of the DIMM.

According to this embodiment, the packaging density of flash memories is raised in the information processing device 100 in which multiple DIMMs (10A, 10B, 10C) are mounted horizontally to the socket 11 of the motherboard 17 extending in the vertical direction, so that the performance of the information processing device 100 is improved while the arrangement relations between the heat-sensitive flash memories and heat-dissipating components are optimized in order to maximize the service life of the components constituting the mixed memory modules.

DESCRIPTION OF REFERENCE CHARACTERS

10 Memory module
10A First memory module
10B Second memory module
10C Third memory module
11A DIMM socket
11B DIMM socket
11C DIMM socket
12 (12A, 12B, 12C) Double-sided substrate
13 Address memory controller (MCA)
14 Data memory controller (MCD)
15 SDRAM
16 Flash memory (Flash)

17 Motherboard
18 Ground line
19 Memory bus line
20 CPU
60 Via hole
62A Socket terminal
100 Information processing device

The invention claimed is:

1. A memory module having different types of memories mounted together thereon, the memory module comprising:
   a double-sided substrate having a first edge and a second edge opposite the first edge;
   a plurality of memory controllers;
   a plurality of flash memories; and
   a plurality of second memories having a higher signal transmission rate than the rate of the flash memories;
   wherein a socket terminal for connecting the double-sided substrate to a motherboard is formed on the first edge side of the double-sided substrate and on the front and the back surface of the double-sided substrate;
   wherein the memory controllers are disposed at positions on the second edge side of the double-sided substrate;
   wherein the second memories are disposed on the second edge side of the double-sided substrate and at corresponding positions opposite the positions at which the memory controllers are disposed; and
   wherein the flash memories are disposed on at least the back surface of the double-sided substrate and at positions that are closer to the first edge than the memory controllers and the second memories.

2. The memory module having different types of memories mounted together thereon according to claim 1,
   wherein the flash memories are disposed only on the back surface of the double-sided substrate.

3. The memory module having different types of memories mounted together thereon according to claim 2,
   wherein a conductor path is formed as a wiring layer connecting the socket terminal to the memory controllers on the front surface of the double-sided substrate corresponding to the back surface on which the flash memories are disposed.

4. The memory module having different types of memories mounted together thereon according to claim 1,
   wherein the second memories are dynamic random access memories (DRAMs); and
   wherein the memory controllers include one address memory controller and a plurality of data memory controllers corresponding to the DRAMs and the flash memories.

5. The memory module having different types of memories mounted together thereon according to claim 4,
   wherein the DRAMs and the data memory controllers are directly connected to each other through via holes at the mutually corresponding positions on the front surface and the back surface of the double-sided substrate.

6. The memory module having different types of memories mounted together thereon according to claim 1,
   wherein the flash memories are disposed on the front surface and the back surface of the double-sided substrate located closer to the first edge.

7. The memory module having different types of memories mounted together thereon according to claim 1,
   wherein a first ground layer and a second ground layer are formed as different layers in the double-sided substrate;
   wherein the second ground layer is divided into a ground line for the data memory controllers and another ground line for the flash memories; and
   wherein the ground line is common to flash memory interfaces of the data memory controllers and to the flash memories.

8. An information processing device having different types of memories mounted together therein, the information processing device comprising:
   at least one central processing unit (CPU);
   a plurality of memory modules each having different types of memories mixedly mounted thereon;
   a motherboard connecting the CPU to the memory modules; and
   an interface allowing the CPU to access the different types of memories;
   wherein each of the memory modules includes:
   a double-sided substrate having a first edge and a second edge opposite the first edge;
   a plurality of memory controllers;
   a plurality of flash memories; and
   a plurality of second memories having a higher signal transmission rate than the transmission rate of the flash memories;
   wherein a socket terminal for connecting the double-sided substrate to the motherboard is formed on the front surface and the back surface of the double-sided substrate on the first edge side;
   wherein the memory controllers are disposed at positions on the second edge side of the double-sided substrate;
   wherein the second memories are disposed on the second edge side of the double-sided substrate at positions opposite the positions at which the memory controllers are disposed; and
   wherein the flash memories are disposed on at least the back surface of the double-sided substrate at positions that are closer to the first edge than are the positions at which the memory controllers and the second memories are disposed.

9. The information processing device having different types of memories mounted together therein according to claim 8,
   wherein the CPU is connected to the motherboard;
   wherein the double-sided substrate and the CPU are mounted perpendicularly to the motherboard disposed horizontally;
   wherein the surface of each of the double-sided substrates facing the CPU is considered to be the front surface and the surface opposite the front surface is considered to be the back surface;
   wherein one of the memory modules that is mounted on the motherboard at the closest position to the CPU is provided as a first memory module; and
   wherein the flash memories of the first memory module are disposed only on the back surface of the double-sided substrate.

10. The information processing device having different types of memories mounted together therein according to claim 9,
    wherein a conductor path is formed as a wiring layer connecting the socket terminal to the memory controllers on the front surface of the double-sided substrate corresponding to the back surface on which the flash memories are disposed.

11. The information processing device having different types of memories mounted together therein according to claim 10,
    wherein another one of the memory modules positioned farther from the CPU than the first memory module is provided as a second memory module; and wherein the flash memories of the second memory module are disposed on the front surface and the back surface of the double-sided substrate.

12. The information processing device having different types of memories mounted together therein according to claim 8,
wherein the second memories are dynamic random access memories (DRAMs;
wherein the memory controllers include one address memory controller and a plurality of data memory controllers corresponding to the DRAMs and the flash memories;
wherein when data is to be read from the flash memories, the memory controllers read data from flash memories and then write the read data to the DRAMs before reading the written data from the DRAMs; and
wherein, when data is to be written to the flash memories, the memory controllers write the data to the DRAMs and then read the written data from the DRAM before writing the read data to the flash memories.

13. The information processing device having different types of memories mounted together therein according to claim 8,
wherein the CPU is connected to the motherboard;
wherein the motherboard is disposed perpendicularly;
wherein the double-sided substrate of each of the memory modules and the CPU are mounted horizontally on the motherboards;
wherein the surface of the double-sided substrate of each of the memory modules facing the CPU is considered to be the front surface and the surface opposite the front surface is considered to be the back surface;
wherein one of the memory modules that is mounted on the motherboard at the closest position to the CPU is provided as a first memory module;
wherein the flash memories are disposed at least on the back surface of the double-sided substrate at positions closer to the first edge than the memory controllers and the second memories; and
wherein there is provided means for forcibly directing a flow of cooling air from a fan, the means being used to form the flow of cooling air in such a manner that the flash memories are on the windward side.

14. An information processing device having different types of memories mounted together therein, the information processing device comprising:
at least one central processing unit (CPU);
a plurality of memory modules each having different types of memories mixedly mounted thereon;
a motherboard connecting the CPU to the memory modules; and
an interface allowing the CPU to access the different types of memories;
wherein each of the memory modules includes:
a double-sided substrate having a first edge and a second edge opposite the first edge;
a plurality of memory controllers;
a plurality of flash memories; and
a plurality of second memories having a higher signal transmission rate than the transmission rate of the flash memories;
wherein a socket terminal for connecting the double-sided substrate to the motherboard is formed on the front surface and the back surface of the double-sided substrate on the first edge side;
wherein the memory controllers are disposed at positions on the second edge side of the double-sided substrate;
wherein the second memories are disposed on the second edge side of the double-sided substrate at positions opposite the positions at which the memory controllers are disposed;
wherein a first ground layer and a second ground layer are formed as different layers in the double-sided substrate;
wherein the second ground layer is divided into a ground line for the data memory controllers and another ground line for the flash memories; and
wherein the flash memories are disposed at least on the back surface of the double-sided substrate at positions closer to the first edge than the memory controllers and the second memories.

15. The information processing device having different types of memories mounted together therein according to claim 14,
wherein the ground line is common to flash memory interfaces of the data memory controllers and to the flash memories.

* * * * *